United States Patent
Pelley

(10) Patent No.: US 8,659,964 B2
(45) Date of Patent: Feb. 25, 2014

(54) BIPOLAR PRIMARY SENSE AMPLIFIER

(75) Inventor: Perry H. Pelley, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 65 days.

(21) Appl. No.: 13/412,680

(22) Filed: Mar. 6, 2012

(65) Prior Publication Data
US 2013/0235686 A1    Sep. 12, 2013

(51) Int. Cl.
*G11C 7/00* (2006.01)

(52) U.S. Cl.
USPC ............ 365/203; 365/205; 365/207

(58) Field of Classification Search
USPC .................................. 327/52, 63
See application file for complete search history.

(56) References Cited

U.S. PATENT DOCUMENTS

| | | | |
|---|---|---|---|
| 4,658,159 A * | 4/1987 | Miyamoto | 327/52 |
| 4,853,899 A * | 8/1989 | Kitsukawa et al. | 365/207 |
| 4,984,202 A | 1/1991 | Kawahara et al. | |
| 5,287,314 A * | 2/1994 | Flannagan et al. | 365/208 |
| 5,289,414 A * | 2/1994 | Hatsuda | 365/189.07 |
| 5,687,127 A * | 11/1997 | Takahashi | 365/205 |
| 6,492,211 B1 | 12/2002 | Divakaruni et al. | |
| 6,608,789 B2 * | 8/2003 | Sullivan et al. | 365/205 |

OTHER PUBLICATIONS

Feng, et al., "Gate Controlled Vertical-Lateral NPN Bipolar Transistor in 90nm RF CMOS Process", IEEE BCTM 2.2, 2008, pp. 29-32.

* cited by examiner

*Primary Examiner* — Tan T. Nguyen
(74) *Attorney, Agent, or Firm* — James L. Clingan, Jr.; David G. Dolezal

(57) ABSTRACT

A sense amplifier for a memory includes two bipolar transistors and isolation switches for selectively coupling and decoupling the base of the bipolar transistors to bit lines during portions of a read cycle. The sense amplifier has a feedback circuit that couples the collector of one of the bipolar transistors to the base of the other bipolar transistor and vice versa.

20 Claims, 5 Drawing Sheets

BIPOLAR PRIMARY SENSE AMPLIFIER

BACKGROUND

1. Field

This disclosure relates generally to sense amplifiers, and more specifically, to primary sense amplifiers that use bipolar transistors.

2. Related Art

Memories have sense amplifiers that sense data present in an array of memory cells that are critical to the performance of the particular memory. Thus, the design of the sense amplifiers is considered significant. In a sensing scheme, the amplifier that is closest to the memory cells may be called a primary sense amplifier. The primary sense amplifier is generally the most critical in sensing quickly and reliably. Any improvement in the primary sense amplifier is likely to result in a measurable improvement in the overall memory.

Accordingly, there is a continuing need to improve primary sense amplifiers.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a primary sense amplifier has bipolar transistors that are cross coupled, have their emitters at least partially pre-biased to alleviate delays in the responsiveness to signal inputs. The sense amplifier is isolated from bit lines to aid in bringing complementary outputs to a greater differential more quickly. Since the offset bipolar pair mismatch is much smaller than the N-channel pair mismatch of traditional sense amplifiers much smaller signals can be sensed with bipolar sense amplifiers. This is better understood with reference to the drawings and the following description.

Figure 1:
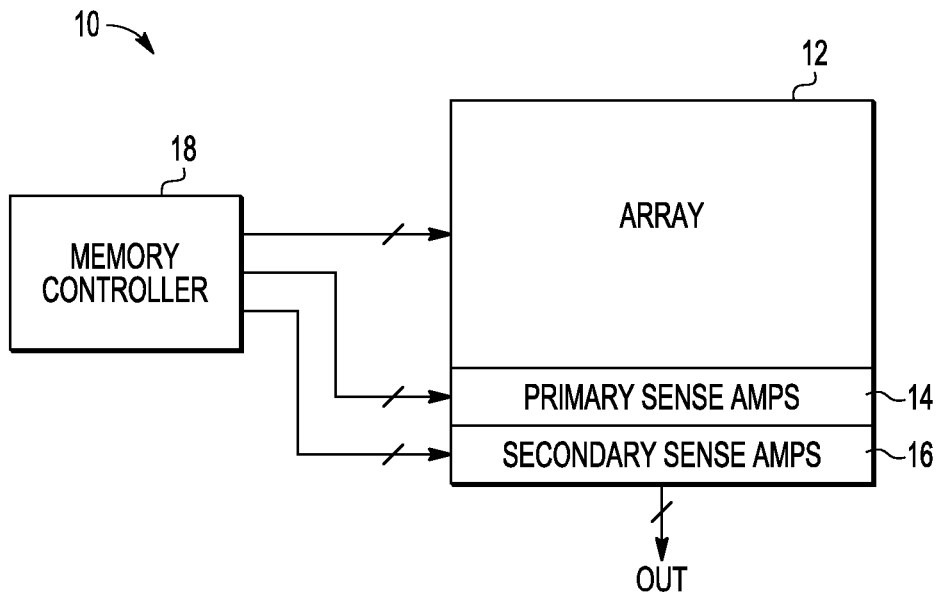
FIG. 1 is a block diagram of a memory according to an embodiment.

Shown in FIG. 1 is a memory 10 comprising an array 12, primary sense amps 14 coupled to array 12, secondary sense amplifiers (amps) 16 coupled to primary sense amplifiers (amps) 14, and a memory controller coupled to array 12, primary sense amps 14, and secondary sense amps 16. Memory 10 functions to store information that can be written to and read from array 12. Primary sense amps 14 comprises a plurality of primary sense amplifiers that are for reading data from array 12 and are the first amplifiers to receive data from the memory cells. That is, for each primary sense amplifier, there is no intervening amplifier between the primary sense amplifier and the memory cells that are being read by that primary sense amplifier.

Figure 2:
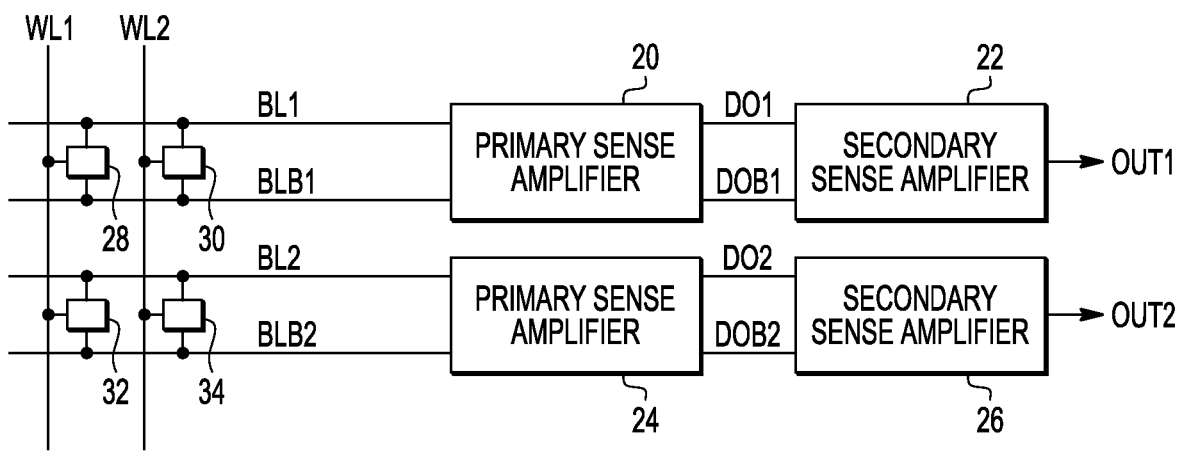
FIG. 2 is a block diagram of a portion of the memory of FIG. 1.

Shown in FIG. 2 is portion of primary sense amps 14, a portion of array 12, and a portion of secondary sense amps 16. The portion of array 12 includes a memory cell 28 connected to word line WL1 and bit line BL1 and complementary bit line BLB1, a memory cell 230 connected to word line WL2 and bit line BL1 and complementary bit line BLB1, a memory cell 32 connected to word line WL1 and bit line BL2 and complementary bit line BLB2, and a memory cell 34 connected to word line WL2 and bit line BL2 and complementary bit line BLB2. The portion of primary sense amps 14 includes a primary sense amplifier 20 coupled to bit lines BL1 and BLB1 and coupled to output line DO1 and complementary output line DOB1 and a sense amplifier 24 coupled to bit lines BL2 and BLB2 and coupled to output line DO2 and complementary output line DOB2. The portion of secondary sense amps 16 includes a secondary sense amplifier 22 coupled to output lines DO1 and DOB1 and providing an output OUT 1 and includes a secondary sense amp 26 coupled to output lines DO2 and DOB2 and providing an output OUT 2. Primary sense amplifier 20 reads data provided onto bit lines BL1 and BLB1 by one of the memory cells coupled to those bit lines such as memory cells 28 and 30. Primary sense amplifier 24 reads data on bit lines BL2 and BLB2 in the same manner. Secondary sense amplifiers 22 and 26 provide further amplification, such as current gain, of signals from primary sense amplifiers 20 and 24, respectively. Memory cells 28, 30, 32, and 34 may be static ram memory cells.

Figure 3:
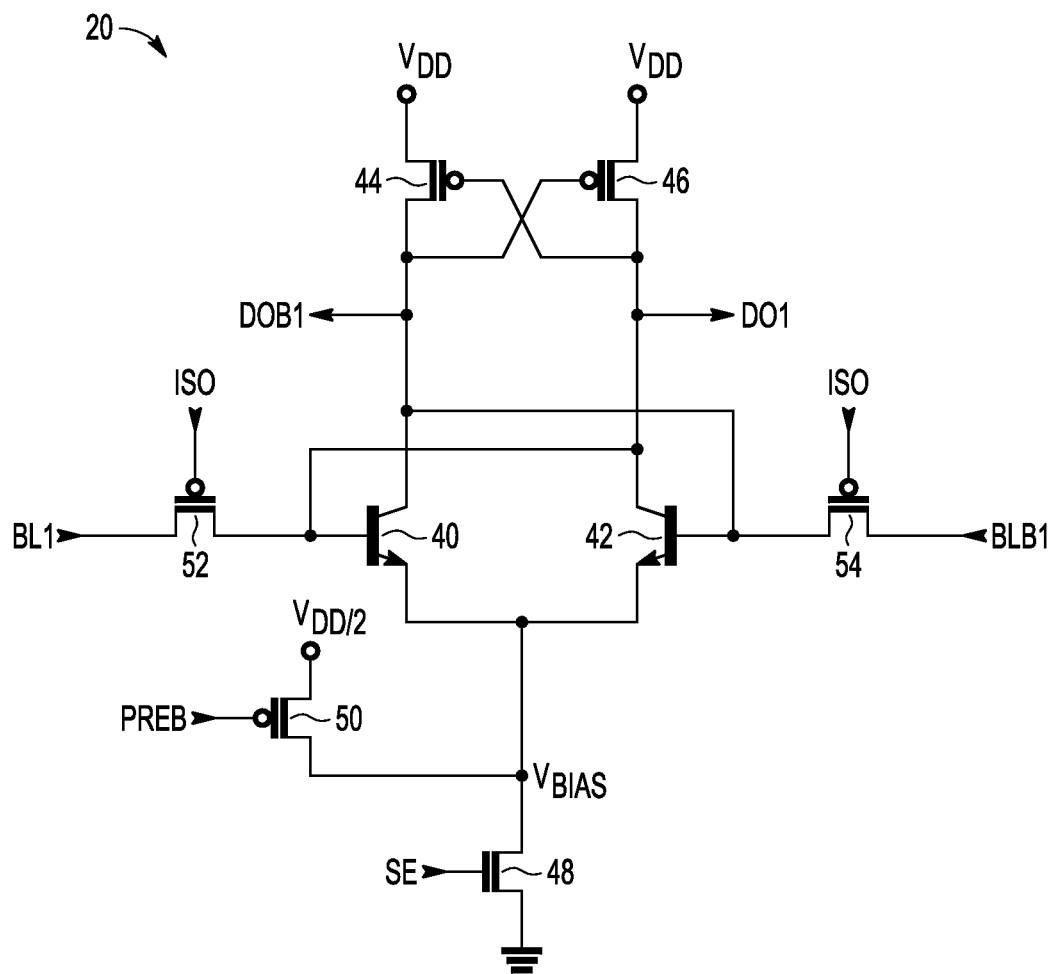
FIG. 3 is a circuit diagram of primary sense amplifier of the portion of the memory of FIG. 2.

Shown in FIG. 3 is primary sense amplifier 20 comprising an NPN transistor 40, an NPN transistor 42, a P channel transistor 44, a P channel transistor 46, an N channel transistor 48, a P channel transistor 50, a P channel transistor 52, and P channel transistor 54. Transistor 40 has an emitter connected to a node Vbias, a collector, and a base. Transistor 42 has an emitter connected to node Vbias, a base connected to the collector of transistor 40, and a collector connected to the base of transistor 40. Transistor 44 has a source connected to a positive power supply terminal VDD, a gate connected to the collector of transistor 42, and a drain connected to the collector of transistor 40. Transistor 46 has a source connected to terminal VDD, a gate connected to the collector of transistor 40, and a drain connected to the collector of transistor 42. Transistor 48 has a source connected to a negative power supply terminal, which in this case is ground, a gate for receiving a sense enable signal SE, a drain connected to node Vbias. Transistor 50 has a source connected to a reference, which in this case is ½ of VDD, a gate for receiving a precharge signal PREB that is active at a logic low, and a drain connected to node Vbias. Transistor 52 has a gate for receiving an isolation signal ISO, a first current electrode connected to the base of transistor 40, and a second current electrode connected to bit line BL1. Transistor 54 has a gate for receiving isolation signal ISO, a first current electrode connected to the base of transistor 42, and a second current electrode connected to bit line BLB1. Transistors 52 and 54 function as isolation switches that couple and decouple responsive to isolation signal ISO.

Figure 4:
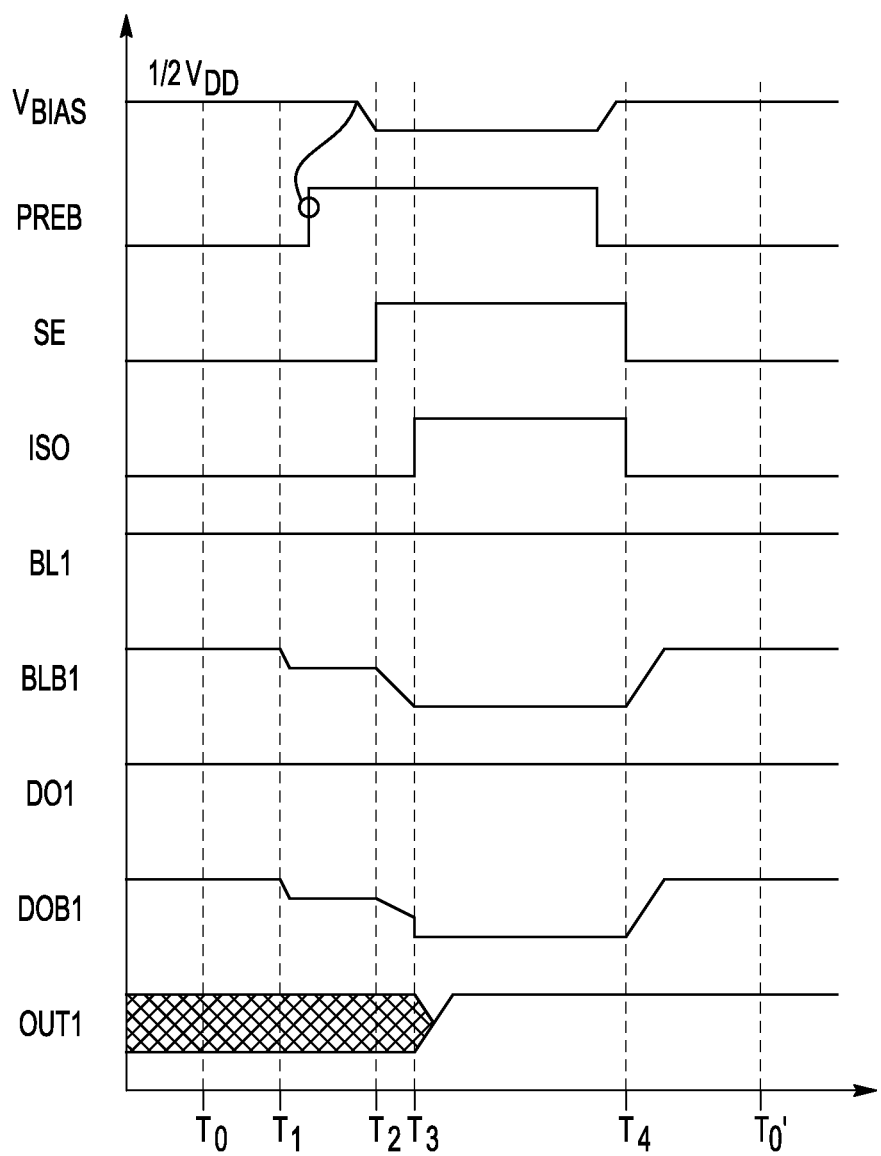
FIG. 4 is a timing diagram of the primary sense amplifier of FIG. 3.

Shown in FIG. 4 is a timing diagram of various signals relevant to the operation of primary sense amplifier 20 and useful in describing the operation of primary sense amplifier 20. A time T0 is a starting point of a sensing operation. At time T0, precharge signal PREB is a logic low so that transistor 50 is conductive so which in turn biases node Vbias to ½ VDD. An example of a voltage for VDD is 1.0 volt. Sense enable SE is a logic low so that transistor 48 is non-conductive. Isolation signal ISO is a logic low so that transistors 52 and 54 are conductive. Bit lines BL1 and BLB1 are a logic high. Data out signals DO1 and DOB1 are a logic high. The output signal OUT1 from secondary sense amplifier 26 is whatever the previous read and is not relevant to the read about to be performed and in that sense is considered indeterminate. With the bases of transistors 40 and 42 at VDD and the emitters at ½ VDD, the base to emitter voltage is about 0.5 volt which keeps transistors substantially non-conductive.

At a time T1, a next read cycle begins by a word line such as word line WL1 is enabled. In this example, the memory cell being read, which may be cell 28, is assumed to be at a logic high. Thus in response to word line WL1 being enabled, memory cell 28 begins reducing the voltage on complementary bit line BLB1 which causes the voltage of complementary data output bar DOB1 to be reduced through transistor 54 being coupled to complementary bit line BLB1. At a time from time T1 to a time before next time T2, precharge signal PREB switches to a logic high which decouples the ½ VDD voltage from node Vbias. After precharge signal PREB switches to a logic high, node Vbias is left floating with a voltage of ½ VDD. The base-emitters of transistors 40 and 42 are therefor partially charged. If transistors 40 and 42 were at VDD, there would be a delay in obtaining the needed bias of about 0.7 volt as compared to the case as described in which the base emitter voltage is pre-biased at 0.5 volt with the base at VDD, 1.0 volt in this example, and the emitter at ½ VDD, 0.5 volt in this example. With power supply voltages tending toward lower levels, ½ VDD could be less than 0.5 volt (500 millivolts) and thus, for example, the difference between the bit line precharge voltage and node Vbias could be approximately 400-500 millivolts.

At a time T2, sense enable signal SE switches to a logic high which causes transistor 48 to be conductive which in turn allows primary sense amplifier 20 to begin amplifying. Initially amplification occurs because transistor 40 is conducting a larger current than transistor 42. Due to the current differential, the voltage on complementary bit line BLB1 begins decreasing at a greater rate which causes signal DOB1 to also decrease which causes transistor 46 to become conductive holding signal DO1 at VDD and thus the base of transistor 40 at VDD. Also node Vbias is brought low to around 0.7 of a volt below the bit line voltages on BL1 and BLB1 by transistor 48 being conductive and limited by the base emitter voltage of transistor 40. Sensing of the data state of the accessed memory cell is started during this time after time T2 T2 by increasing the voltage differential on the bases of transistors 40 and 42 and the bitlines. Also during this time the base emitter junctions of transistors 40 and 42 are further charged from the bit line capacitance resulting in the collector currents of transistors 40 and 42 being substantially increased.

At time T3, after the initial amplification of the voltage differential between bit lines BLB1 and BL and the corresponding bases of transistors 40 and 42 following time T2, at a time T3, signal ISO is switched to a logic high which isolates the load of bit lines BLB1 and BL1 from cross coupled transistors 40 and 42 and cross coupled transistors 44 and 46. Transistors 44 and 46 function as a load circuit. The result of the isolation is that the amplifier is isolated from the bit lines, and outputs DO1 and DOB1 are quickly brought to their final voltages completing the amplification process in response to signal SE switching to a logic high. Signal DO1 is near VDD and signal DOB1 is at about 0.2 volts, the saturation voltage of transistor 40. At this time the signals on DO1 and DOB1 are ready for further processing by secondary sense amplifier 22.

To begin to prepare for the next read cycle, sense enable SE is brought to a logic low to disable the sensing function and isolation signal ISO is brought to a logic low to couple bit lines BL1 and BLB1 to the bases of transistors 40 and 42 respectively. At some time prior to time T4 and after time T3, precharge signal PREB is brought to a logic low to again pre-bias the emitters of transistors 40 and 42 to ½ VDD. After bit lines bit lines BLB1 and BL1 and data outputs DOB1 and DO1 have stabilized, the next read cycle may begin which may be at time T01' as shown in FIG. 4.

Figure 5:
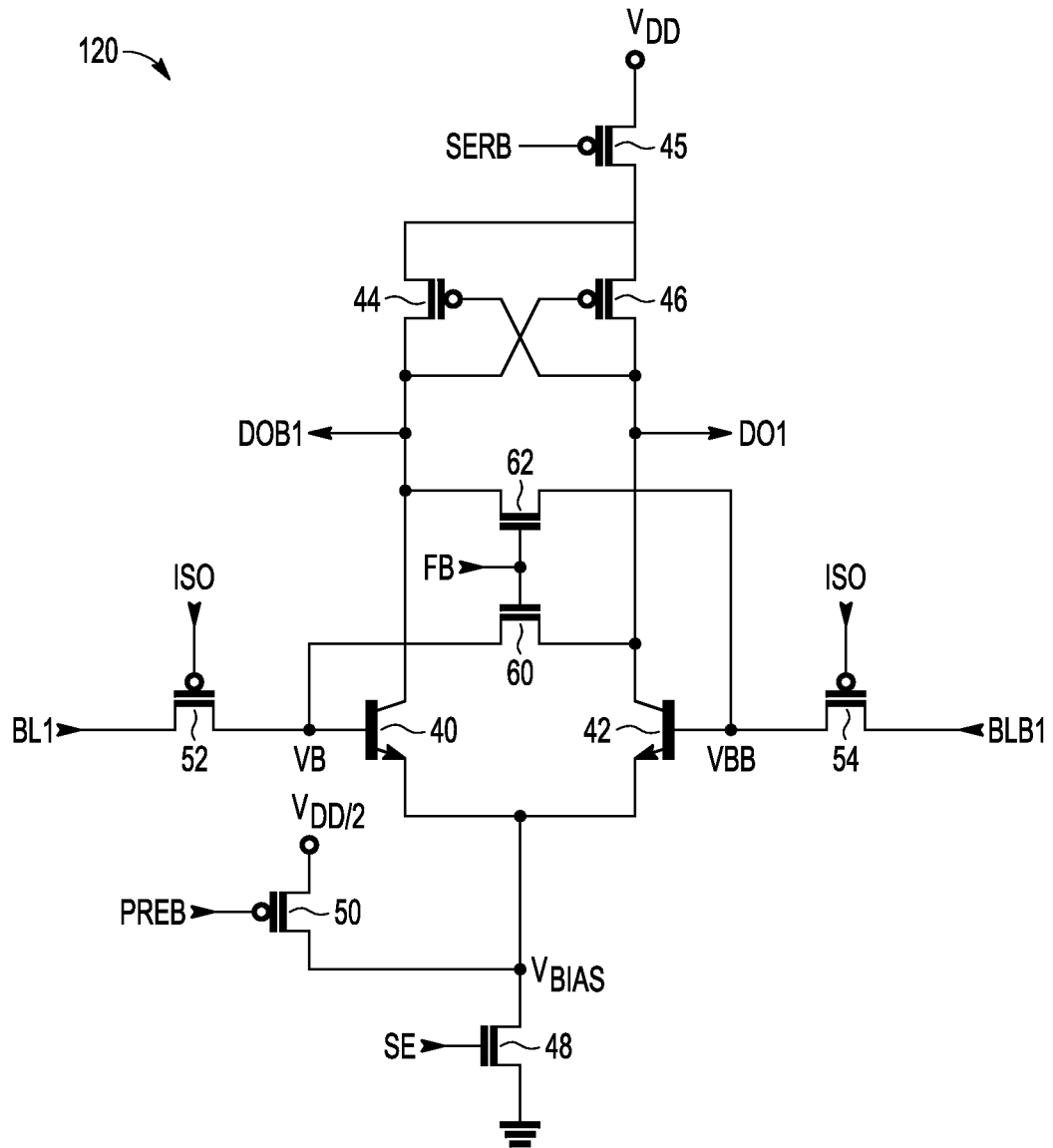
FIG. 5 is a circuit diagram of a primary sense amplifier to that is a modification of primary sense amplifier of FIG. 3.

Shown in FIG. 5 is a primary sense amplifier 120 that may be used in place of primary sense amplifier 20. Primary sense amplifier 20 has been modified to form primary sense amplifier 120 by adding transistor 45 between the source of transistors 44 and 45 and the positive supply VDD for conditionally coupling the load transistors 44 and 46 to the positive supply VDD. In addition N channel transistors 60 and 62 which are controlled by a feedback signal FB are added for selectively controlling feedback in primary sense amplifier 120. Transistors 60 and 62 provide for the ability for timing for the feedback between transistors 40 and 42. Instead of a direct connection between the base of transistor 42 and the collector of transistor 40 and a direct connection between the base of transistor 40 and the collector of transistor 42, there are transistors 62 and 60 for enabling timing for those connections. Transistor 62 has a gate for receiving feedback signal FB, a first current electrode coupled to the base of transistor 42 shown also as node VBB, and a second current electrode coupled to the collector of transistor 40. Transistor 60 has a gate for receiving feedback signal FB, a first current electrode coupled to the base of transistor 40 shown also as node VB, and a second current electrode coupled to the collector of transistor 42. The SER signal is provided at VDD or ground. Transistor 45 has a source coupled to the positive supply VDD, a drain coupled to the sources of transistors 44 and 45 and a gate electrode coupled to a signal SERB. SERB is provided at VDD or GND.

Figure 6:
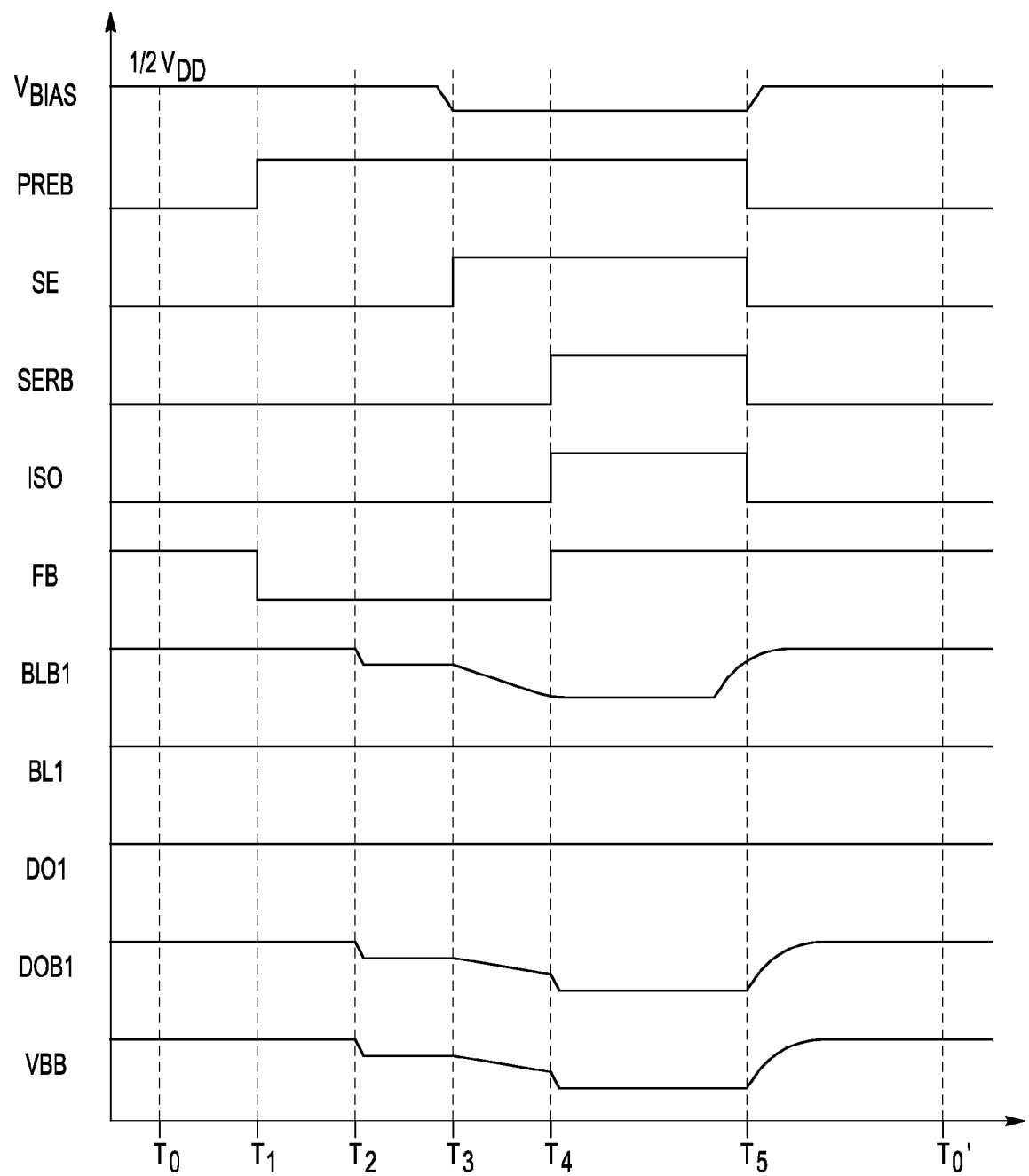
FIG. 6 is a circuit diagram of the primary sense amplifier of FIG. 5.

Shown in FIG. 6 is a timing diagram for primary sense amplifier 120 showing initial conditions for a read at time T0 in which Vbias is a ½ VDD, precharge PREB is at ground, sense enable SE is at ground, the SERB signal is at VDD, isolation signal ISO is at ground, feedback signal is at VDD causing transistors 60 and 62 to be conductive and providing feedback, bit lines BL1 and BLB1 are at VDD, Data out signals DO1 and DOB1 are at VDD, and base nodes VB and VBB are at a logic high.

At time T1, precharge PREB is switched to a logic high so that node Vbias is floating but remains at ½ VDD until sense enable SE is active at time T3, and feedback FB is switched to a logic low turning off the feedback provided by transistors 60 and 62.

At time T2, a word line such as word line WL1 is enabled causing bit line BLB1 to begin reducing in voltage relative to BL1. The bases of Transistors 40 and 42 track the BL and BLB voltage respectively.

At time T3, sense enable SE switches to a logic high causing transistor 48 to become conductive and allowing transistors 40 and 42 to begin conducting current. Initially the currents in transistors 40 and 44 are small but they increase as the base emitter junctions of transistors 40 and 42 are further charged from BL and BLB respectively. The reduction in signal voltage on the base of transistor 42 results in a relatively small amount of current through transistor 42. Since the collectors of transistors 40 and 42 are unloaded even the small currents while the base emitter junctions are charging can increase signal size, significantly faster than the sense amplifier 20 where the collectors are loaded by the bit line capacitance. The time period between T3 and T4 ends with a much larger signal between the collectors of transistors 40 and 42 than between their respective bases. Both DO1 and DO1B are below VDD. Time period between T3 and T4 ends before transistor 40 becomes saturated.

At time T4, feedback signal FB switches to VDD, and isolation signal ISO switches to VDD transistors 52 and 54 to be non-conductive, and transistors 40 and 42 to be cross coupled. The SERB signal switches to a VSS for coupling data output DO1 along with the collector of transistor 42 and the base of transistor 40 to VDD. The cross coupling results in a charge sharing of the capacitances of the coupled base of transistor 42 and the collector of transistor 40. This charge sharing results in the voltage on DOB1 being coupled to a level that is between voltages on the collector of transistor 40 and the base of transistor 42 at the end of time period between T3 and T4. This coupling results in a signal between DO and DOB early in time period between T4 and T5 that is larger than the signal level between the bases of Transistor 40 and 42 at the end of time period between T3-T4. Amplification proceeds an a way similar to the amplification of sense amplifier 20 resulting in a latched separation at nodes VB and VBB and data outputs DO1 and DOB1. This completes the read in primary sense amplifier 120.

In preparation for the next read, at time T5, precharge PREB switches to a logic low causing ½ VDD to be applied to node Vbias, signal SE switching to a logic low disabling amplification, the SERB signal switches to a logic high, isolation signal ISO switches to a logic low enabling transistors 52 and 54. The bit lines, the data outputs, and the base voltages return to VDD. After this stabilizes at a time T0', another read may begin.

Thus, there is shown an effective way to obtain a primary sense amplifier using bipolar transistors.

Shown then is a sense amplifier that includes a first bipolar transistor including a base, an emitter, and a collector. The sense amplifier further includes a second bipolar transistor including a base, an emitter, and a collector, the emitter of the first bipolar transistor and the emitter of the second bipolar transistor are coupled together. The sense amplifier further includes a first input coupled to a first bit line. The sense amplifier further includes a second input coupled to a second bit line, the second bit line is complementary to the first bit line. The sense amplifier further includes a first isolation switch for selectively coupling and decoupling the base of the first bipolar transistor to the first input, wherein the base of the first bipolar transistor is decoupled from the first input during a portion of a read cycle of the sense amplifier. The sense amplifier further includes a second isolation switch for selectively coupling and decoupling the base of the second bipolar transistor to the second input, wherein the base of the second bipolar transistor is decoupled from the second input during a portion of a read cycle of the sense amplifier. The sense amplifier further includes a feedback circuit, the feedback circuit is arranged such that the base of the first bipolar transistor is coupled to the collector of the second bipolar transistor and the base of the second bipolar transistor is coupled to the collector of the first bipolar transistor during at least portion of a read cycle of the sense amplifier. The sense amplifier may have a further characterization by which the feedback circuit is characterized by the base of the first bipolar transistor is connected to the collector of the second bipolar transistor and the base of the second bipolar transistor is connected to the collector of the first bipolar transistor. The sense amplifier may have a further characterization by which the feedback circuit decouples the base of the first bipolar transistor from the collector of the second bipolar transistor and decouples the base of the second bipolar from the collector of the first bipolar transistor during at least part of a read cycle of the sense amplifier. The sense amplifier may have a further characterization by which the base of the first bipolar transistor is decoupled from the collector of the second bipolar transistor and the base of the second bipolar transistor is decoupled from the collector of the first bipolar transistor during a first part of a read cycle of the sense amplifier and wherein the base of the first bipolar transistor is coupled to the collector of the second bipolar transistor and the base of the second bipolar transistor is coupled to the collector of the first bipolar transistor during a second part of a read cycle of the sense amplifier, the second part being after the first part. The sense amplifier may have a further characterization by which at least during a portion of the first part of a read cycle, the first input is coupled by the first isolation switch to the base of the first bipolar transistor and the second input is coupled by the second isolation switch to the base of the second bipolar transistor, wherein during at least portion of the second part of a read cycle, the first input is decoupled from the base of the first bipolar transistor and the second input is decoupled from the base of the second bipolar transistor. The sense amplifier may further include a load circuit having a first terminal connected to a first data output of the sense amplifier and to the collector of the first bipolar transistor, the load circuit having a second terminal connected to a second data output of the sense amplifier and to the collector of the second bipolar transistor, wherein the load circuit includes two cross coupled transistors, wherein a first current terminal of each of the two cross coupled transistors is connected to a first node, a control terminal of a first transistor of the two cross coupled transistors is connected to a second current terminal of the second transistor of the two cross coupled transistors and to the second terminal of the load circuit, wherein a control terminal of a second transistor of the two cross coupled transistors is connected to a second current terminal of the first transistor of the two cross coupled transistors and to the first terminal of the load circuit. The sense amplifier may have a further characterization by which. The sense amplifier may have a further characterization by which wherein the first node is at a first voltage level during at least a portion of a read cycle of the sense amplifier and is at second voltage level that is higher than the first voltage level during another portion of the read cycle. The sense amplifier may further include a bias circuit, the bias circuit biasing the emitters of the first bipolar transistor and the second bipolar transistor to a first voltage level during a pre-charge period, the first voltage level is less than a second voltage level, the first and second bit lines are precharged to the second voltage level during the pre-charge period. The sense amplifier may have a further characterization by which the first voltage level is approximately 400-500 millivolts below the second voltage level. The sense amplifier may have a use in which a memory including an an array of memory cells, where the array of memory cells are configured in columns of memory cells and a plurality of sense amplifiers previously described, wherein each sense amplifier of the plurality of sense amplifiers is couplable to a column of the columns to read a cell of the column.

Also disclosed is method of reading a memory cell. The method further includes operating a sense amplifier such that during a first portion of a read cycle of a memory cell, a first bit line coupled to the memory cell is coupled to a base of a first bipolar transistor of the sense amplifier and a second bit-line is coupled to a base of a second bipolar transistor of the sense amplifier, wherein an emitter of the first bipolar transistor is connected to an emitter of the second bipolar transistor. The method further includes operating the sense amplifier during a second portion of the read cycle, such that the first bit line is decoupled from the base of the first bipolar transistor and the second bit line is decoupled from the base of the second bipolar transistor, wherein wherein the second portion occurs after the first portion, wherein during at least a portion of the second portion, the base of the first bipolar transistor is coupled to a collector of the second bipolar transistor and the base of the second bipolar transistor is coupled to a collector of the first bipolar transistor. The method may further include asserting a select enable signal to the sense amplifier during the first portion of the read cycle, wherein the second portion occurs after the sense enable signal is asserted. The method may have a further characterization by which the base of the first bipolar transistor is coupled to the collector of the second bipolar transistor and the base of the second bipolar transistor is coupled to the collector of the first bipolar transistor during the entire portion of the read cycle. The method may have a further characterization by which the base of the first bipolar transistor is decoupled from the collector of the second bipolar transistor and the base of the second bipolar transistor is decoupled from the collector of the first bipolar transistor during at least a portion of the first portion of the read cycle. The method may further include during a period prior to the read cycle, pre-charging the first bit line and the second bit line to a first pre-charge voltage and during the period, pre-charging the emitters of the first bipolar transistor and the second bipolar transistor to a second pre-charge voltage, wherein the first pre-charge voltage is greater than the second pre-charge voltage level. The method may have a further characterization by which the second pre-charge voltage level is approximately 400-500 millivolts below the first pre-charge voltage level. The method may have a further characterization by which a load circuit has a first terminal connected to the collector of first bipolar transistor and a second terminal connected to the collector of the second bipolar transistor, the load circuit includes a third terminal, wherein during a least a portion of the second portion of the read cycle, a power supply voltage is provided to the load circuit through the third terminal, wherein during at least a portion of the first portion of the read cycle, the power supply voltage is not provided though the third terminal to the load circuit. The method may have a further characterization by which the memory cell is characterized as a static ram memory cell.

The present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, a different power supply voltage may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A sense amplifier, comprising:
  a first bipolar transistor including a base, an emitter, and a collector;
  a second bipolar transistor including a base, an emitter, and a collector, the emitter of the first bipolar transistor and the emitter of the second bipolar transistor are coupled together;
  a first input coupled to a first bit line;
  a second input coupled to a second bit line, the second bit line is complementary to the first bit line;
  a first isolation switch for selectively coupling and decoupling the base of the first bipolar transistor to the first input, wherein the base of the first bipolar transistor is decoupled from the first input during a portion of a read cycle of the sense amplifier;
  a second isolation switch for selectively coupling and decoupling the base of the second bipolar transistor to the second input, wherein the base of the second bipolar transistor is decoupled from the second input during a portion of a read cycle of the sense amplifier; and
  a feedback circuit, the feedback circuit is arranged such that the base of the first bipolar transistor is coupled to the collector of the second bipolar transistor and the base of the second bipolar transistor is coupled to the collector of the first bipolar transistor during at least portion of a read cycle of the sense amplifier, and the feedback circuit decouples the base of the first bipolar transistor from the collector of the second bipolar transistor and decouples the base of the second bipolar from the collector of the first bipolar transistor during at least part of a read cycle of the sense amplifier.

2. The sense amplifier of claim 1 wherein the base of the first bipolar transistor is decoupled from the collector of the second bipolar transistor and the base of the second bipolar transistor is decoupled from the collector of the first bipolar transistor during a first part of a read cycle of the sense amplifier and wherein the base of the first bipolar transistor is coupled to the collector of the second bipolar transistor and the base of the second bipolar transistor is coupled to the collector of the first bipolar transistor during a second part of a read cycle of the sense amplifier, the second part being after the first part.

3. The sense amplifier of claim 2 wherein at least during a portion of the first part of a read cycle, the first input is coupled by the first isolation switch to the base of the first bipolar transistor and the second input is coupled by the second isolation switch to the base of the second bipolar transistor, wherein during at least portion of the second part of a read cycle, the first input is decoupled from the base of the first bipolar transistor and the second input is decoupled from the base of the second bipolar transistor.

4. The sense amplifier of claim 1 further comprising:
a load circuit having a first terminal connected to a first data output of the sense amplifier and to the collector of the first bipolar transistor, the load circuit having a second terminal connected to a second data output of the sense amplifier and to the collector of the second bipolar transistor;
wherein the load circuit includes two cross coupled transistors, wherein a first current terminal of each of the two cross coupled transistors is connected to a first node, a control terminal of a first transistor of the two cross coupled transistors is connected to a second current terminal of the second transistor of the two cross coupled transistors and to the second terminal of the load circuit, wherein a control terminal of a second transistor of the two cross coupled transistors is connected to a second current terminal of the first transistor of the two cross coupled transistors and to the first terminal of the load circuit.

5. The sense amplifier of claim 4 wherein the first node is connected to a power supply voltage.

6. The sense amplifier of claim 4 wherein the first node is at a first voltage level during at least a portion of a read cycle of the sense amplifier and is at second voltage level that is higher than the first voltage level during another portion of the read cycle.

7. The sense amplifier of claim 1 further comprising a bias circuit, the bias circuit biasing the emitters of the first bipolar transistor and the second bipolar transistor to a first voltage level during a pre-charge period, the first voltage level is less than a second voltage level, the first and second bit lines are pre-charged to the second voltage level during the pre-charge period.

8. The sense amplifier of claim 7 wherein the first voltage level is approximately 400-500 millivolts below the second voltage level.

9. A method of reading a memory cell, comprising:
operating a sense amplifier such that during a first portion of a read cycle of a memory cell, a first bit line coupled to the memory cell is coupled to a base of a first bipolar transistor of the sense amplifier and a second bit-line is coupled to a base of a second bipolar transistor of the sense amplifier;
wherein an emitter of the first bipolar transistor is connected to an emitter of the second bipolar transistor;
operating the sense amplifier during a second portion of the read cycle, such that the first bit line is decoupled from the base of the first bipolar transistor and the second bit line is decoupled from the base of the second bipolar transistor;
during a period prior to the read cycle, pre-charging the first bit line and the second bit line to a first pre-charge voltage; and
during the period, pre-charging the emitters of the first bipolar transistor and the second bipolar transistor to a second pre-charge voltage, wherein the first pre-charge voltage is greater than the second pre-charge voltage level;
wherein the second portion occurs after the first portion, wherein during at least a portion of the second portion, the base of the first bipolar transistor is coupled to a collector of the second bipolar transistor and the base of the second bipolar transistor is coupled to a collector of the first bipolar transistor.

10. The method of claim 9 further comprising:
asserting a select enable signal to the sense amplifier during the first portion of the read cycle, wherein the second portion occurs after the sense enable signal is asserted.

11. The method of claim 9 wherein the base of the first bipolar transistor is coupled to the collector of the second bipolar transistor and the base of the second bipolar transistor is coupled to the collector of the first bipolar transistor during the entire portion of the read cycle.

12. The method of claim 9 wherein the base of the first bipolar transistor is decoupled from the collector of the second bipolar transistor and the base of the second bipolar transistor is decoupled from the collector of the first bipolar transistor during at least a portion of the first portion of the read cycle.

13. The method of claim 9 wherein the second pre-charge voltage level is approximately 400-500 millivolts below the first pre-charge voltage level.

14. The method of claim 9 wherein a load circuit has a first terminal connected to the collector of first bipolar transistor and a second terminal connected to the collector of the second bipolar transistor, the load circuit includes a third terminal, wherein during a least a portion of the second portion of the read cycle, a power supply voltage is provided to the load circuit through the third terminal, wherein during at least a portion of the first portion of the read cycle, the power supply voltage is not provided though the third terminal to the load circuit.

15. The method of claim 9 wherein the memory cell is characterized as a static ram memory cell.

16. A sense amplifier, comprising:
a first bipolar transistor including a base, an emitter, and a collector;
a second bipolar transistor including a base, an emitter, and a collector, the emitter of the first bipolar transistor and the emitter of the second bipolar transistor are coupled together;
a first input coupled to a first bit line;
a second input coupled to a second bit line, the second bit line is complementary to the first bit line;
a first isolation switch for selectively coupling and decoupling the base of the first bipolar transistor to the first input, wherein the base of the first bipolar transistor is decoupled from the first input during a portion of a read cycle of the sense amplifier;
a second isolation switch for selectively coupling and decoupling the base of the second bipolar transistor to the second input, wherein the base of the second bipolar transistor is decoupled from the second input during a portion of a read cycle of the sense amplifier;
a feedback circuit, the feedback circuit is arranged such that the base of the first bipolar transistor is coupled to the collector of the second bipolar transistor and the base of the second bipolar transistor is coupled to the collector of the first bipolar transistor during at least portion of a read cycle of the sense amplifier; and
a bias circuit, the bias circuit biasing the emitters of the first bipolar transistor and the second bipolar transistor to a first voltage level during a pre-charge period, the first voltage level is less than a second voltage level, the first and second bit lines are pre-charged to the second voltage level during the pre-charge period.

17. The sense amplifier of claim 16 wherein the first voltage level is approximately 400-500 millivolts below the second voltage level.

18. The sense amplifier of claim 16 wherein the base of the first bipolar transistor is decoupled from the collector of the second bipolar transistor and the base of the second bipolar transistor is decoupled from the collector of the first bipolar transistor during a first part of a read cycle of the sense amplifier and wherein the base of the first bipolar transistor is coupled to the collector of the second bipolar transistor and the base of the second bipolar transistor is coupled to the collector of the first bipolar transistor during a second part of a read cycle of the sense amplifier, the second part being after the first part.

19. The sense amplifier of claim 18 wherein at least during a portion of the first part of a read cycle, the first input is coupled by the first isolation switch to the base of the first bipolar transistor and the second input is coupled by the second isolation switch to the base of the second bipolar transistor, wherein during at least portion of the second part of a read cycle, the first input is decoupled from the base of the first bipolar transistor and the second input is decoupled from the base of the second bipolar transistor.

20. The sense amplifier of claim 16 further comprising:

a load circuit having a first terminal connected to a first data output of the sense amplifier and to the collector of the first bipolar transistor, the load circuit having a second terminal connected to a second data output of the sense amplifier and to the collector of the second bipolar transistor;

wherein the load circuit includes two cross coupled transistors, wherein a first current terminal of each of the two cross coupled transistors is connected to a first node, a control terminal of a first transistor of the two cross coupled transistors is connected to a second current terminal of the second transistor of the two cross coupled transistors and to the second terminal of the load circuit, wherein a control terminal of a second transistor of the two cross coupled transistors is connected to a second current terminal of the first transistor of the two cross coupled transistors and to the first terminal of the load circuit.

\* \* \* \* \*